(12) United States Patent
Zhou et al.

(10) Patent No.: US 12,052,039 B2
(45) Date of Patent: Jul. 30, 2024

(54) PULSE WIDTH SIGNAL OVERLAP COMPENSATION TECHNIQUES

(71) Applicant: Adesto Technologies Corporation, Santa Clara, CA (US)

(72) Inventors: Shiyu Zhou, Cork (IE); Cormac O'Sullivan, Cork (IE)

(73) Assignee: Adesto Technologies Corporation, Santa Clara, CA (US)

( * ) Notice: Subject to any disclaimer, the term of this patent is extended or adjusted under 35 U.S.C. 154(b) by 47 days.

(21) Appl. No.: 17/408,225

(22) Filed: Aug. 20, 2021

(65) Prior Publication Data
US 2021/0384893 A1 Dec. 9, 2021

Related U.S. Application Data

(63) Continuation of application No. PCT/US2019/059277, filed on Oct. 31, 2019.
(Continued)

(51) Int. Cl.
| | |
|---|---|
| H03K 3/00 | (2006.01) |
| H03F 1/42 | (2006.01) |
| H03F 3/19 | (2006.01) |
| H03F 3/45 | (2006.01) |
| H03K 3/011 | (2006.01) |
| H03K 5/04 | (2006.01) |
| H03K 7/08 | (2006.01) |
| H03M 1/12 | (2006.01) |
| H03M 1/66 | (2006.01) |
| H04B 1/12 | (2006.01) |

(Continued)

(52) U.S. Cl.
CPC .............. *H04B 1/16* (2013.01); *H03F 1/42* (2013.01); *H03F 3/19* (2013.01); *H03F 3/45475* (2013.01); *H03K 3/011* (2013.01); *H03K 5/04* (2013.01); *H03K 7/08* (2013.01); *H03M 1/1215* (2013.01); *H03M 1/128* (2013.01); *H03M 1/662* (2013.01); *H04B 1/126* (2013.01); *H04B 1/18* (2013.01); *H04B 7/043* (2013.01); *H03F 2200/294* (2013.01); *H03F 2200/36* (2013.01); *H03F 2200/451* (2013.01)

(58) Field of Classification Search
CPC ........ H03K 5/1565; H03K 5/04; H03K 3/017; H03K 7/08; H03K 19/20; H03K 3/011
See application file for complete search history.

(56) References Cited

U.S. PATENT DOCUMENTS

| | | | |
|---|---|---|---|
| 5,651,029 A | * | 7/1997 | Yang ................... H04L 25/4904 375/296 |
| 6,029,052 A | | 2/2000 | Isberg |

(Continued)

*Primary Examiner* — Tuan T Lam (57) ABSTRACT

A pulse signal compensation circuit of a pulse generator can include a pulse measurement circuit and a compensation generator circuit. The pulse measurement circuit can be configured to receive a plurality of pulse signals and to generate an average duty cycle or pulse overlap signal proportional to the duty cycle or pulse overlap of the plurality of pulses. The compensation generator circuit can be configured to receive the average duty cycle or pulse overlap signal and generate a duty cycle or pulse overlap compensation signal based on the average duty cycle or pulse overlap signal. The compensation signal can be utilized to adjust the duty cycle, amount of positive or negative pulse width overlap, and or the like of the plurality of pulse signals.

19 Claims, 7 Drawing Sheets

Related U.S. Application Data

(60) Provisional application No. 62/851,489, filed on May 22, 2019.

(51) Int. Cl.
    *H04B 1/16*         (2006.01)
    *H04B 1/18*         (2006.01)
    *H04B 7/0426*     (2017.01)

(56) References Cited

U.S. PATENT DOCUMENTS

| | | | |
|---|---|---|---|
| 9,660,629 B2 * | 5/2017 | Im | H03K 5/1565 |
| 2007/0139102 A1 | 6/2007 | Laletin | |
| 2008/0057899 A1 | 3/2008 | Montemayor | |
| 2008/0191757 A1 * | 8/2008 | Choi | H03K 5/1565 |
| | | | 327/175 |
| 2010/0158138 A1 | 6/2010 | Ryu | |
| 2013/0229215 A1 | 9/2013 | Sadwick | |
| 2016/0182019 A1 * | 6/2016 | Seo | H03K 5/26 |
| | | | 327/175 |
| 2016/0218893 A1 | 7/2016 | Waheed | |
| 2017/0214318 A1 | 7/2017 | Takenaka | |
| 2019/0081619 A1 * | 3/2019 | Kim | H03K 5/1565 |
| 2020/0312399 A1 * | 10/2020 | Brox | G11C 11/4076 |

* cited by examiner

PULSE WIDTH SIGNAL OVERLAP COMPENSATION TECHNIQUES

CROSS-REFERENCE TO RELATED APPLICATIONS

This is a continuation of PCT Patent Application No. PCT/US2019/059277 filed Oct. 31, 2019, which claims the benefit of U.S. Provisional Patent Application No. 62/851,489 filed May 22, 2019, which are incorporated herein in their entirety.

BACKGROUND OF THE INVENTION

The duty cycle and or pulse widths of signals are important to the control of numerous electronic systems. In addition, some applications utilize a plurality of pulse signals that require accurate duty cycles, pulse synchronization, pulse overlap and or pulse separation. For example, a plurality of pulse signals can be utilized in receiving and transmitting signals in wireless communication systems such as cellular telephone networks, satellite communication, WiFi and the like. In another example, a plurality of pulse signals can be utilized in transmission of data across communication buses in devices. In other examples, a plurality of pulse signals can be utilized in discrete time analog filters, memory devices, and the like. The plurality of pulse signals are typically subject to variations due to process, voltage, temperature, and the like. As the signal rate in various electronic systems continue to increase, it becomes more challenging to accurately generate a plurality of pulse signals with a given duty cycle, pulse synchronization, amount of pulse overlap and or amount of pulse separation. Accordingly, there is a continuing need for improved techniques for generating a plurality of pulse signals that can compensate for process, voltage, and temperature (PVT) variations and other similar deleterious effects at higher signal rates.

SUMMARY OF THE INVENTION

Embodiments of the present invention may best be understood by referring to the following description and accompanying drawings that are used to illustrate embodiments of the present invention directed toward pulse signal compensation techniques. The pulse signal compensation techniques include apparatuses and methods for generating feedback signals that can measure the duty cycle, pulse synchronization, pulse width, amount of pulse overlap, amount of pulse separation or other similar parameters of a plurality of pulse signals. The feedback signals can generate a compensation signal to adjust the plurality of pulse signals to compensate for process variations, supply voltage variations, operating temperature variations, and other similar variations that can affect the accuracy of the plurality of pulse signals.

In one embodiment, a pulse signal compensation circuit can include a pulse measurement circuit and a compensation generator circuit. The pulse measurement circuit can be configured to receive a plurality of pulse signals characterized by duty cycle and or pulse overlap parameters that are subject to various due to manufacturing process variations, operating voltage variations, operating temperature variations, and or the like. The pulse measurement circuit can be configured to generate an average duty cycle or pulse overlap signal proportional to the duty cycle and or pulse overlap of the plurality of pulse signals. The compensation generator circuit can be configured to receive the average duty cycle and pulse overlap signal, and generate a compensation signal based on the average duty cycle or pulse overlap signal. The duty cycle or pulse overlap compensation signal can be utilized to adjust the duty cycle, amount of pulse width overlap, amount of pulse separation and or the like of the plurality of pulse signals.

In another embodiment, a pulse signal compensation circuit can include a pulse generator, a pulse measurement circuit, and a compensation generator circuit. The pulse generator can be configured to generate a plurality of pulse signals as a function of a pulse duty cycle or pulse overlap compensation signal. The pulse measurement circuit can be coupled to the pulse generator to receive the plurality of pulse signals. The pulse measurement circuit can be configured to generate an average duty cycle or pulse overlap signal as a function of the duty cycle and or pulse overlap of the plurality of pulse signals. The compensation circuit can be coupled between the pulse measurement circuit and the pulse generator. The compensation generator circuit can be configured to generate the duty cycle or pulse overlap compensation signal based on the average duty cycle or pulse overlap signal.

In yet another embodiment, a method of compensating a duty cycle and or pulse overlap of a plurality of pulse signals can include generating an average duty cycle or pulse overlap measurement signal of the plurality of pulse signals. A duty cycle or pulse overlap compensation signal can be generated as a function of the average duty cycle or pulse overlap measurement signal. The duty cycle and or pulse overlap of the plurality of pulse signals can be compensated using the duty cycle or pulse overlap compensation signal.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

BRIEF DESCRIPTION OF THE DRAWINGS

Embodiments of the present invention are illustrated by way of example and not by way of limitation, in the figures of the accompanying drawings and in which like reference numerals refer to similar elements and in which.

DETAILED DESCRIPTION OF THE INVENTION

Reference will now be made in detail to the embodiments of the present invention, examples of which are illustrated in the accompanying drawings. While the present invention will be described in conjunction with these embodiments, it will be understood that they are not intended to limit the invention to these embodiments. On the contrary, the invention is intended to cover alternatives, modifications and equivalents, which may be included within the scope of the invention as defined by the appended claims. Furthermore, in the following detailed description of the present invention, numerous specific details are set forth in order to provide a thorough understanding of the present invention. However, it is understood that the present invention may be practiced without these specific details. In other instances, well-known methods, procedures, components, and circuits have not been described in detail as not to unnecessarily obscure aspects of the present invention.

Some embodiments of the present invention which follow are presented in terms of routines, modules, logic blocks, and other symbolic representations of operations on data within one or more electronic devices. The descriptions and representations are the means used by those skilled in the art to most effectively convey the substance of their work to others skilled in the art. A routine, module, logic block and/or the like, is herein, and generally, conceived to be a self-consistent sequence of processes or instructions leading to a desired result. The processes are those including physical manipulations of physical quantities. Usually, though not necessarily, these physical manipulations take the form of electric or magnetic signals capable of being stored, transferred, compared and otherwise manipulated in an electronic device. For reasons of convenience, and with reference to common usage, these signals are referred to as data, bits, values, elements, symbols, characters, terms, numbers, strings, and/or the like with reference to embodiments of the present invention.

It should be borne in mind, however, that all of these terms are to be interpreted as referencing physical manipulations and quantities and are merely convenient labels and are to be interpreted further in view of terms commonly used in the art. Unless specifically stated otherwise as apparent from the following discussion, it is understood that through discussions of the present invention, discussions utilizing the terms such as "receiving," and/or the like, refer to the actions and processes of an electronic device such as an electronic computing device that manipulates and transforms data. The data is represented as physical (e.g., electronic) quantities within the electronic device's logic circuits, registers, memories and/or the like, and is transformed into other data similarly represented as physical quantities within the electronic device.

In this application, the use of the disjunctive is intended to include the conjunctive. The use of definite or indefinite articles is not intended to indicate cardinality. In particular, a reference to "the" object or "a" object is intended to denote also one of a possible plurality of such objects. It is also to be understood that the phraseology and terminology used herein is for the purpose of description and should not be regarded as limiting.

Figure 1:
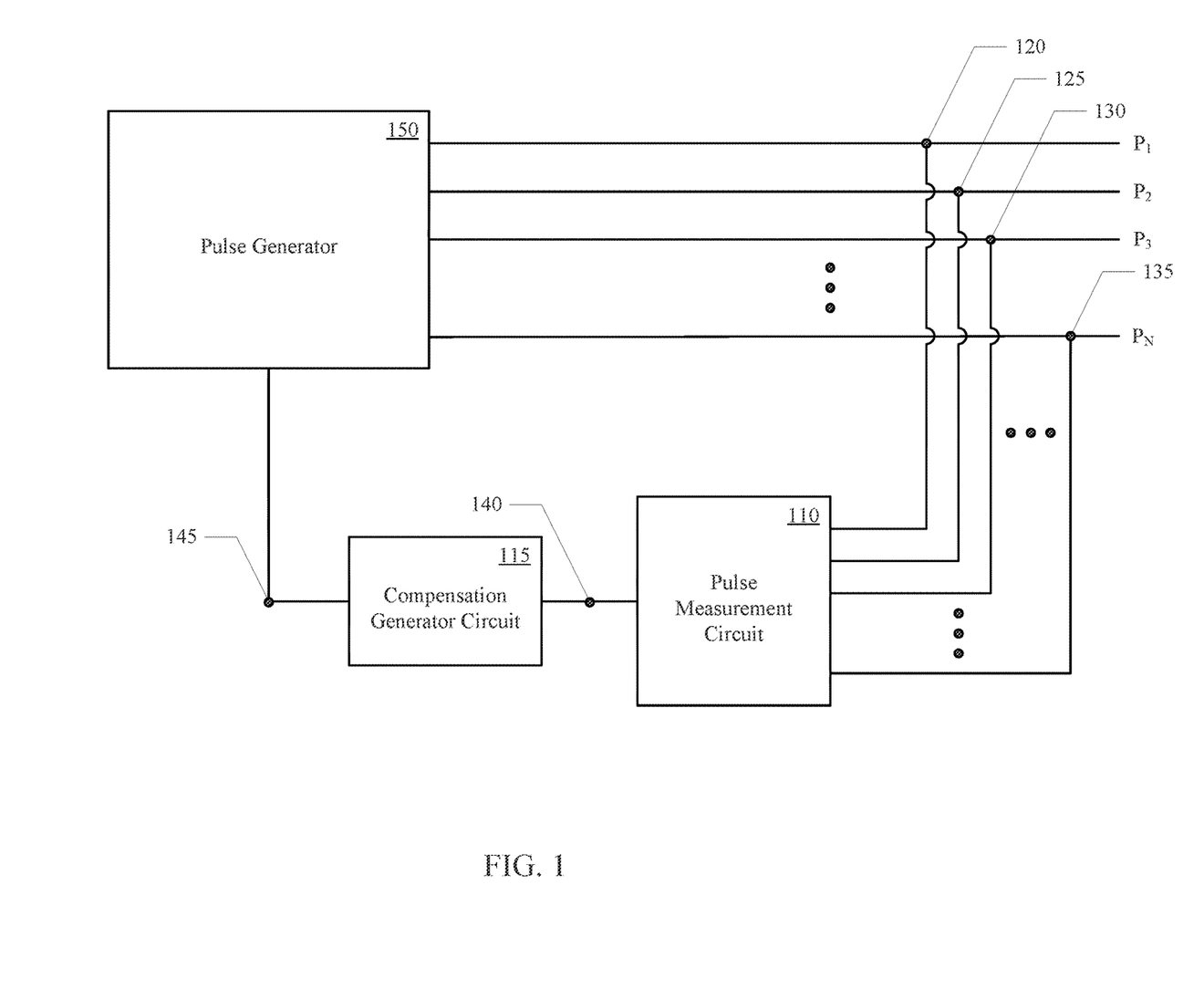
FIG. 1 shows a pulse signal compensation circuit, in accordance with embodiments of the present invention.

Referring to FIG. 1, a pulse signal compensation circuit, in accordance with embodiments of the present invention, is shown. The pulse signal compensation circuit can include a pulse measurement circuit 110 and a compensation generator circuit 115. The pulse measurement circuit 110 can receive a plurality of pulse signals $P_1$-$P_N$ 120-135. The pulse measurement circuit 110 can be configured to generate an average duty cycle or pulse overlap signal 140 based on the plurality of pulse signals $P_1$-$P_N$ 120-135. As used herein the term pulse overlap is intended to include positive overlap and negative overlap (e.g. non-overlapping). In one implementation, a "0" crossover point of two adjacent pulses can be defined as the voltage point of half pule swing. For example, if the pulse swing is from 0 to $V_{dd}$, the "0" crossover point is $0.5*V_{dd}$. If the crossover point of two adjacent pulses is higher than $0.5*V_{dd}$, the overlap time at $0.5*V_{dd}$ can be defined as "positive." If the cross over point of two adjacent pulses is lower than $0.5*V_{dd}$, the overlap time at $0.5*V_{dd}$ point can be defined as "negative." If the crossover point of two adjacent pulses is equal $0.5*V_{dd}$, the overlap time at $0.5*V_{dd}$ can be defined as non-overlapping.

The compensation generator circuit 115 can be configured to receive the average duty cycle or pulse overlap signal 140 from the pulse measurement circuit 110. The compensation generator circuit 115 can be configured to generate a duty cycle or pulse overlap compensation signal 145 based on the average duty cycle or pulse overlap signal 140.

In one embodiment, the pulse signal compensation circuit 110, 115 can be coupled in a feedback loop to a pulse generator 150. The duty cycle or pulse overlap compensation signal 145 generated by the compensation generator circuit 115 can be utilized by the pulse generator 150 to adjust the duty cycle and or the pulse overlap of the plurality of pulse signals $P_1$-$P_N$ 120-135. Various techniques for adjusting the duty cycle and or pulse overlap of the pulse signals generated by pulse generators are well-known in the art and are not necessary for an understanding of aspects of the present invention, and therefore are not described further herein.

Figure 2:
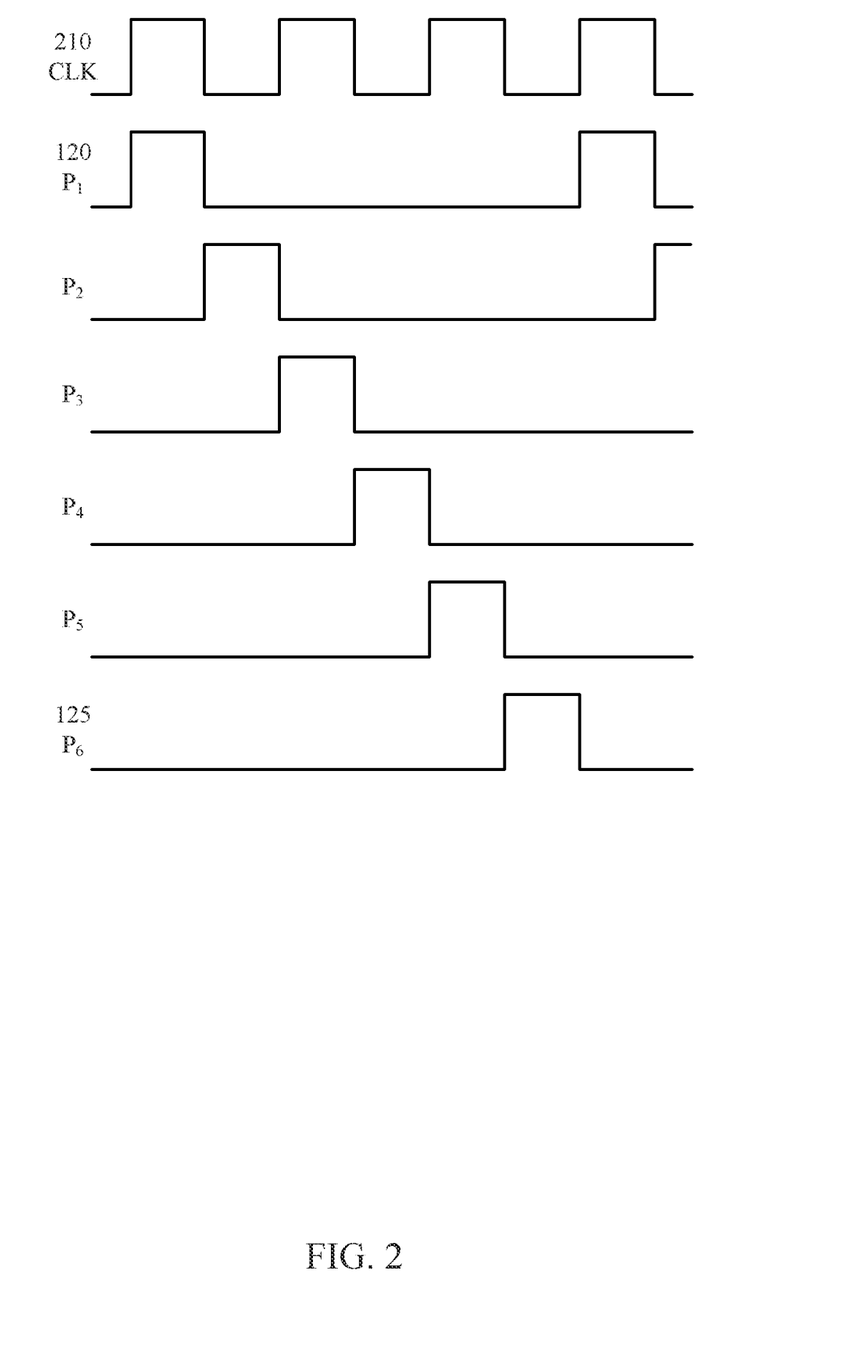
FIG. 2 illustrates an exemplary timing diagram of a plurality of pulse signals.

Referring now to FIG. 2, an exemplary timing diagram of a plurality of pulse signals $P_1$-$P_N$ 120-125 is illustrated. In one implementation, the pulse generator 150 can generate each of a series of phase shifted pulse signals $P_1$-$P_N$ 120-125 from a clock signal (Clk) 210. Although, FIG. 2 illustrates substantially zero overlap between each successive pulse signal, the pulse generator 150 can be configured to generate the plurality of pulse signals $P_1$-$P_N$ 120-125 with a range of different duty cycles and or a range of different predetermined amounts of pulse width overlap.

The duty cycle and or the amount of positive or negative pulse width overlap can vary as a result of manufacturing process variations between different units, and or as a result of varying operating parameters such as temperature, supply potential and the like during operation of the given unit. In one implementation, a "0" crossover point of two adjacent pulses can be defined as the voltage point of half pule swing. For example, if the pulse swing is from 0 to $V_{dd}$, the "0" crossover point is $0.5*V_{dd}$. If the crossover point of two adjacent pulses is higher than $0.5*V_{dd}$, the overlap time at $0.5*V_{dd}$ can be defined as "positive." If the cross over point of two adjacent pulses is lower than $0.5*V_{dd}$, the overlap time at $0.5*V_{dd}$ point can be defined as "negative." If the crossover point of two adjacent pulses is equal $0.5*V_{dd}$, the overlap time at $0.5*V_{dd}$ can be defined as non-overlapping. Referring again to FIG. 1, the pulse measurement circuit 110 can generate the average duty cycle or pulse overlap signal 140 proportional to an average duty cycle or an average pulse overlap of the pulse signals $P_1$-$P_N$ 120-125. The compensation generator circuit 115 can generate the duty cycle or pulse overlap compensation signal 145 based on the average duty cycle or pulse overlap signal 140 and a predetermined desired duty cycle or pulse width overlap. The duty cycle or pulse overlap compensation signal 145 can be fed back from the compensation generator circuit 115 into the pulse generator 150. The pulse generator 150 can then adjust the duty cycle and or pulse overlap of the plurality of pulse signals $P_1$-$P_N$ 120-125 to compensate for variation between the as generated duty cycle and or pulse overlap and the desired duty cycle and or pulse overlap.

In one implementation, the pulse signal compensation circuit 110, 115 can be implemented as a sub-circuit integral to the pulse generator 150. In another implementation, the pulse signal compensation circuit 110, 115 can be implemented as a standalone circuit coupled to a pulse generator 150.

Figure 3:
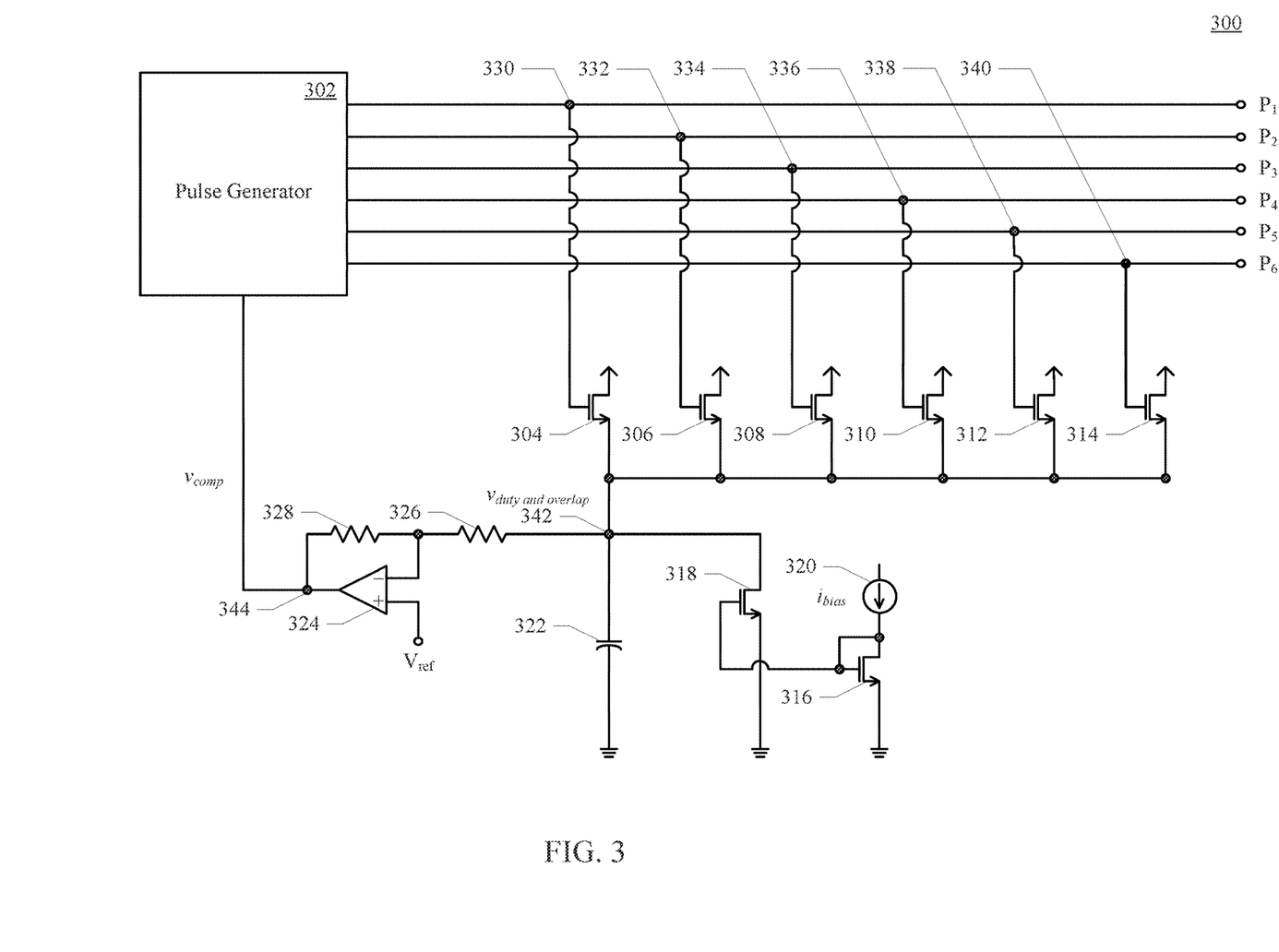
FIG. 3 shows a pulse signal compensation circuit, in accordance with an embodiment of the present invention.

Referring now to FIG. 3, a pulse signal compensation circuit, in accordance with embodiments of the present invention, is shown. The pulse signal compensation circuit 300 can include a pulse generator 302, a pulse measurement circuit 304-322 and a compensation generator circuit 324-328. The pulse generator 302 can be configured to generate a plurality of pulse signals $P_1$-$P_6$ 330-340. Although the pulse generator 302 is illustrated as generating six pulse signals $P_1$-$P_6$ 330-340, a given pulse generator can be configured to generate any number of pulse signals.

The pulse measurement circuit 304-322 can be coupled to receive the plurality of pulse signals $P_1$-$P_6$ 330-340 generated by the pulse generator 302. The pulse measurement circuit 340-322 can be configured to generate an average duty cycle or pulse overlap measurement signal at a first node 342 as a function of an average duty cycle or an average pulse overlap of the plurality of pulse signals $P_1$-$P_6$ 370-395. The compensation generator circuit 324-328 can be coupled between the pulse measurement circuit 304-322 and the pulse generator 302. The compensation generator circuit 324-328 can be configured to generate a duty cycle or pulse overlap compensation signal at a second node 344 based on the average duty cycle or pulse overlap measurement signal.

In one implementation, the pulse generator 302 can be a phase shifting pulse generator configured to generate a plurality of phase shifted pulse signals from a clock signal, as illustrated in FIG. 2 and described above. However, embodiments of the present invention are not limited to phase shifting pulse generators. Instead, the pulse signal compensation feedback circuit as described herein can be utilized with any adjustable pulse generator.

In one implementation, the pulse measurement circuit 304-322 can include a plurality of resistive switching elements 340-314 and a constant current source 316-320. Each resistive switching element 304-314 can be coupled between a first supply potential (e.g., $V_{dd}$) and a first node 342. The constant current source 316-320 can be coupled between the first node 342 and a second supply potential (e.g., gnd). A control terminal of each resistive switching element 304-314 can be coupled to a respective one of the plurality of pulse signals $P_1$-$P_6$ 330-340. In one implementation, each resistive switching element 304-314 can be an n-channel enhancement mode Metal-Oxide-Semiconductor Field Effect Transistor (MOSFET) including a drain coupled to the first supply potential and a source coupled to the first node 342. The gates of the MOSFETs can be coupled to respective ones of the plurality of phase shifted pulse signals $P_1$-$P_6$ 330-340. In one implementation, the constant current source 316-320 can be a current mirror coupled to the first node 342. In an exemplary current mirror, a pair of transistors 316, 318 can have their gates coupled together and their sources coupled to the second supply potential. The gate of a first one of the transistors 316 can also be coupled to its drain. The drain of the first transistor 316 can be coupled to a bias current source 320, and the drain of the second transistor 318 can be coupled to the first node 342. The gate to source voltage is the same for both transistors 316, 318, and therefore the bias current flowing through the first transistors 316 also flows through the second transistor 318. The pulse measurement circuit 304-322 can also include a capacitor 350 coupled between the first node 342 and the second supply potential to filter out transients at the first node 342.

In one implementation, a respective MOSFET turns ON, with a given on-state resistance, when the respective pulse signal is in a high state. If the pulse width of the pulse signals $P_1$-$P_6$ 330-340 are relatively small, the voltage at a first node 342 is relatively low. If the pulse width is relatively large, a voltage at the first node 342 is relatively high. In one example, the average duty cycle or pulse overlap signal $V_{duty\ and\ overlap}$ at the first node 342 can be represented by Equation 1:

$$V_{duty\ and\ overlap} = V_{dd} - f(\text{duty cycle and overlap}) \times i_{bias} \quad (1)$$

wherein $V_{dd}$ represents the supply potential, $i_{bias}$ represents the constant current source, and f(duty cycle and overlap) represents a resistive value that is a function of the average duty cycle and or pulse overlap of the plurality of pulse signals $P_1$-$P_6$ 330-340.

In one implementation, the compensation generator circuit 324-328 can be configured to generate a duty cycle or overlap compensation signal $V_{comp}$ at the second node 344 based on the difference between the average duty cycle or pulse overlap signal $V_{duty\ and\ overlap}$ at the first node 342 and a reference signal $V_{ref}$. For example, the compensation generator circuit 324-328 can include an amplifier configured to apply a predetermined gain to the difference between the average duty cycle or pulse overlap signal $V_{duty\ and\ overlap}$ at the first node 342 and a reference voltage signal $V_{ref}$ to generate the duty cycle or pulse overlap compensation signal $V_{comp}$ at the second node 344. In one example, the duty cycle or pulse overlap compensation signal $V_{comp}$ generated by the compensation generator circuit 324-328 can be represented by Equation 2:

$$V_{comp} = G(V_{ref} - V_{duty\ and\ overlap}) + V_{ref} \quad (2)$$

wherein G represents a gain set by a first and second resistor 326, 328 coupled to the operational amplifier 324. The duty cycle or pulse overlap compensation signal $V_{comp}$ at the second node 344 can be supplied to a duty cycle or pulse overlap compensation input of the pulse generator 302. The resistive switching elements 304-314 and the amplifier 324 gain of the pulse measurement and pulse signal compensation circuit 304-328 can implement a proportional feedback loop for adjusting the duty cycle and or pulse overlap of the plurality of pulse signal $P_1$-$P_6$ 330-340 generated by the pulse generator 302. Furthermore, the pulse signal compensation circuit 304-328 can be considered to be a voltage mode pulse signal compensation circuit.

The duty cycle or pulse overlap compensation signal $V_{comp}$ can be utilized to adjust the duty cycle and or the amount of overlap between the plurality of pulse signals $P_1$-$P_6$ 330-340 to compensate for manufacturing process, voltage, temperature and other similar variations in the pulse generator 302. The improved control of pulse signal duty cycle and or pulse overlap can improve the performance of mixers in transmitters and receivers, and other similar circuits that utilize a plurality of pulse signals.

Again, the pulse signal compensation circuit 304-328 can be implemented as a sub-circuit integral to the pulse generator 302. In another implementation, the pulse signal compensation circuit 304-328 can be implemented as a standalone circuit coupled to a pulse generator 302.

Figure 4:
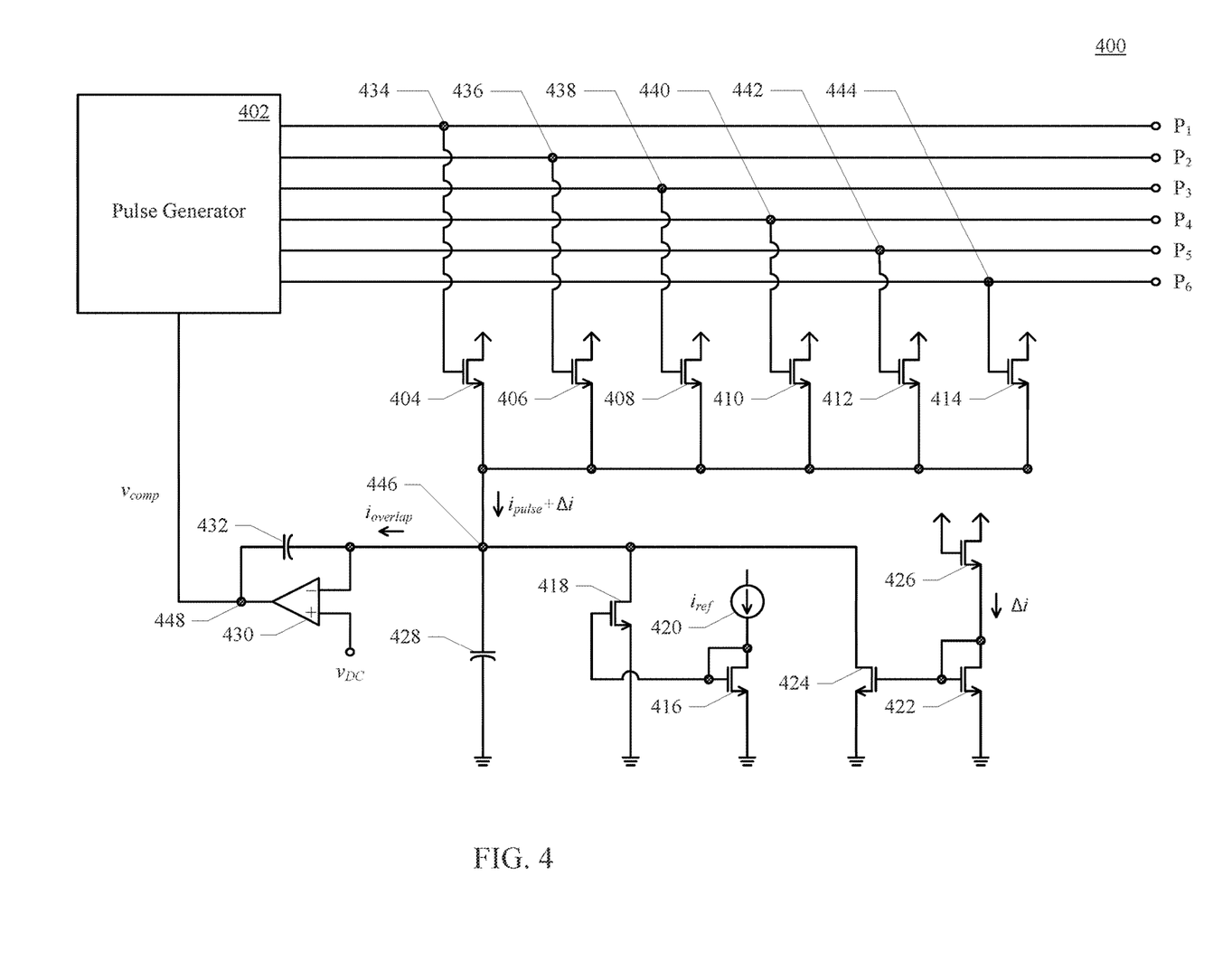
FIG. 4 shows a pulse signal compensation circuit, in accordance with another embodiment of the present invention.

Referring now to FIG. 4, a pulse signal compensation circuit, in accordance with another embodiment of the present invention, is shown. The pulse signal compensation circuit 400 can include a pulse generator 402, a pulse measurement circuit 404-428 and a compensation generator circuit 430, 432. The pulse generator 402 can be configured to generate a plurality of pulse signals $P_1$-$P_6$ 434-444. Although the pulse generator 402 is illustrated as generating six pulse signals $P_1$-$P_6$ 434-444, a given pulse generator can be configured to generate any number of pulse signals.

The pulse measurement circuit 404-428 can be coupled to receive the plurality of pulse signals $P_1$-$P_6$ 434-444 generated by the pulse generator 402. The pulse measurement circuit 404-428 can be configured to generate an average duty cycle or pulse overlap measurement signal at a first node 446 as a function of an average duty cycle or an overage pulse overlap of the plurality of pulse signals $P_1$-$P_6$ 434-444. The compensation generator circuit 430, 432 can be coupled between the pulse measurement circuit 404-428 and the pulse generator 402. The compensation generator circuit 430, 432 can be configured to generate a duty cycle or pulse overlap compensation signal at a second node 448 based on the average duty cycle or pulse overlap signal.

In one implementation, the pulse generator 402 can be a phase shifting pulse generator configured to generate a plurality of phase shifted pulse signals from a clock signal, as illustrated in FIG. 2 and described above. However, embodiments of the present invention are not limited to phase shifting pulse generators. Instead, the pulse signal compensation feedback circuit as described herein can be utilized with any adjustable pulse generator.

In one implementation, the pulse measurement circuit 404-428 can include a plurality of resistive switching elements 404-414 and a constant current source 416-420. Each resistive switching element 404-414 can be coupled between a first supply potential (e.g., $V_{dd}$) and a first node 446. A control terminal of each resistive switching element 404-414 can be coupled to a respective one of the plurality of pulse signals $P_1$-$P_6$ 434-444. In one implementation, each of the resistive switching elements 432-442 can be an n-channel enhancement mode Metal-Oxide-Semiconductor Field Effect Transistor (MOSFET) including a drain coupled to the first supply potential and a source coupled to the first node 446. The gate of the MOSFETs can be coupled to respective ones of the plurality of phase shifted pulse signals $P_1$-$P_6$ 434-444. In one implementation, a respective MOSFET turns ON, with a given on-state resistance, when the respective pulse signal is in a high state. If the pulse width of the respective pulse signals $P_1$-$P_6$ 432-444 is relatively small, a pulse current generated by a respective resistive switching element 404-414 is low. If the pulse width is large, the pulse current is high. The current from the resistive switching elements 432-442 flowing into the first node 446 can be summed in accordance with Kirchhoff's Current Law to produce an average pulse current $i_{pulse}$. The average pulse current $i_{pulse}$ is a function of the average pulse width of the plurality of pulse signals $P_1$-$P_6$ 434-444.

In one implementation, the constant current source 416-420 can be a current mirror coupled to the first node 446. In an exemplary current mirror, a pair of transistors 416, 418 can have their gates coupled together and their sources coupled to a second supply potential. The gates of a first one of the transistors 416 can also be coupled to its drain. The drain of the first transistor 416 can be coupled to a reference current source 420, and the drain of the second transistor 418 can be coupled to the first node 446. The gate to source voltage is the same for both transistors 416, 418, and therefore the reference current $i_{ref}$ flowing through the first transistor 416 also flows through the second transistor 418.

The reference current $i_{ref}$ can be selected to correspond to a desired duty cycle and or pulse width for the plurality of pulse signals $P_1$-$P_6$ 434-444. The reference current $i_{ref}$ can be subtracted from the pulse current $i_{pulse}$ at the first node 446 in accordance with Kirchhoff's Current Law.

The pulse measurement circuit 404-428 can also include a supply compensation current mirror 422-426. In an exemplary supply compensation current mirror, a pair of transistors 422, 424 can have their gates coupled together and their sources coupled to a second supply potential. The gate of a first one of the transistors 42 can be coupled to its drain and the source of a third transistor 426. The third transistor 426 can be coupled in a drain follower configuration, wherein the gate and drain of the third transistor 460 can be coupled to a first supply potential. The drain follower configured third transistor 426 will output a current $\Delta i$ at its source that will vary in proportion to variations in the first supply potential relative to the second supply potential. Furthermore, the gate to source voltage in the first and second transistors 422, 424 is the same and therefore the current variation $\Delta i$ flowing through the first transistor 422 also flows through the second transistor 424. The current variation $\Delta i$ can also be subtracted from the pulse current at the first node 446 in accordance with Kirchhoff's Current Law. In one example, the average pulse overlap signal $i_{overlap}$ flowing out of the first node 446 toward the compensation generator circuit 430, 432 can be represented by Equation 3:

$$i_{overlap} = (i_{pules} + \Delta i) - i_{ref} \Delta i = i_{pulse} - i_{ref} \quad (3)$$

wherein $i_{pulse}$ can be represented by Equation 4:

$$i_{pulse} = \frac{v_{DD}}{f(\text{overlap})} \quad (4)$$

The pulse measurement circuit 404-428 can also include a capacitor 428 coupled between the first node 446 and the second supply potential. The capacitor 428 can be configured to filter out transients at the first node 446.

In one implementation, the compensation generator circuit 430, 432 can include an operational amplifier 430 having a non-inverting input coupled to the duty cycle voltage signal $V_{DC}$, and an inverting input coupled to the first node 446. A capacitor 432 can be coupled between the output and inverting input of the operational amplifier 430. The operation amplifier can integrate the pulse overlap current $i_{overlap}$ to generate a compensation signal at the second node 448. In one example, the duty cycle or pulse overlap compensation signal $v_{comp}$ generated by the compensation generator circuit 430, 432 at a second node 448 can be represented by Equation 5:

$$v_{comp} = v_{dc} - \int \frac{i_{pulse} - i_{ref}}{c} dt \quad (5)$$

wherein c is the capacitance of capacitor 432, and $v_{dc}$ is a voltage input to the non-inverting input of the operational amplifier 430 which is needed for the operational amplifier to operate to produce the duty cycle or pulse overlap compensation signal $v_{comp}$. The resistive switching elements 404-414 and the integrating amplifier 430, 432 can implement a proportional/integrating feedback loop for adjusting the duty cycle and or pulse overlap of the plurality of pulse signals $P_1$-$P_6$ 434-444 generated by the pulse signal generator 402. Furthermore, the pulse signal compensation circuit 430, 432 can be considered to be a current mode pulse compensation circuit.

The duty cycle or overlap compensation signal $V_{comp}$ at the second node 448 can be supplied to the pulse generator 402. The duty cycle or overlap compensation signal $V_{comp}$ can be utilized to adjust the duty cycle and or the amount of positive or negative overlap between the plurality of pulse signals $P_1$-$P_6$ 434-444 to compensate for manufacturing process, voltage, temperature and other similar variations in the pulse generator 402. The improved control of pulse signal duty cycle and or overlap can improve the performance of mixers in transmitters and receivers, and other similar circuits that utilize a plurality of pulse signals.

Again, the pulse signal compensation circuit 404-432 can be implemented as a sub-circuit integral to the pulse generator 402. In another implementation, the pulse signal compensation circuit 404-432 can be implemented as a standalone circuit coupled to a pulse generator 402.

Figure 5:
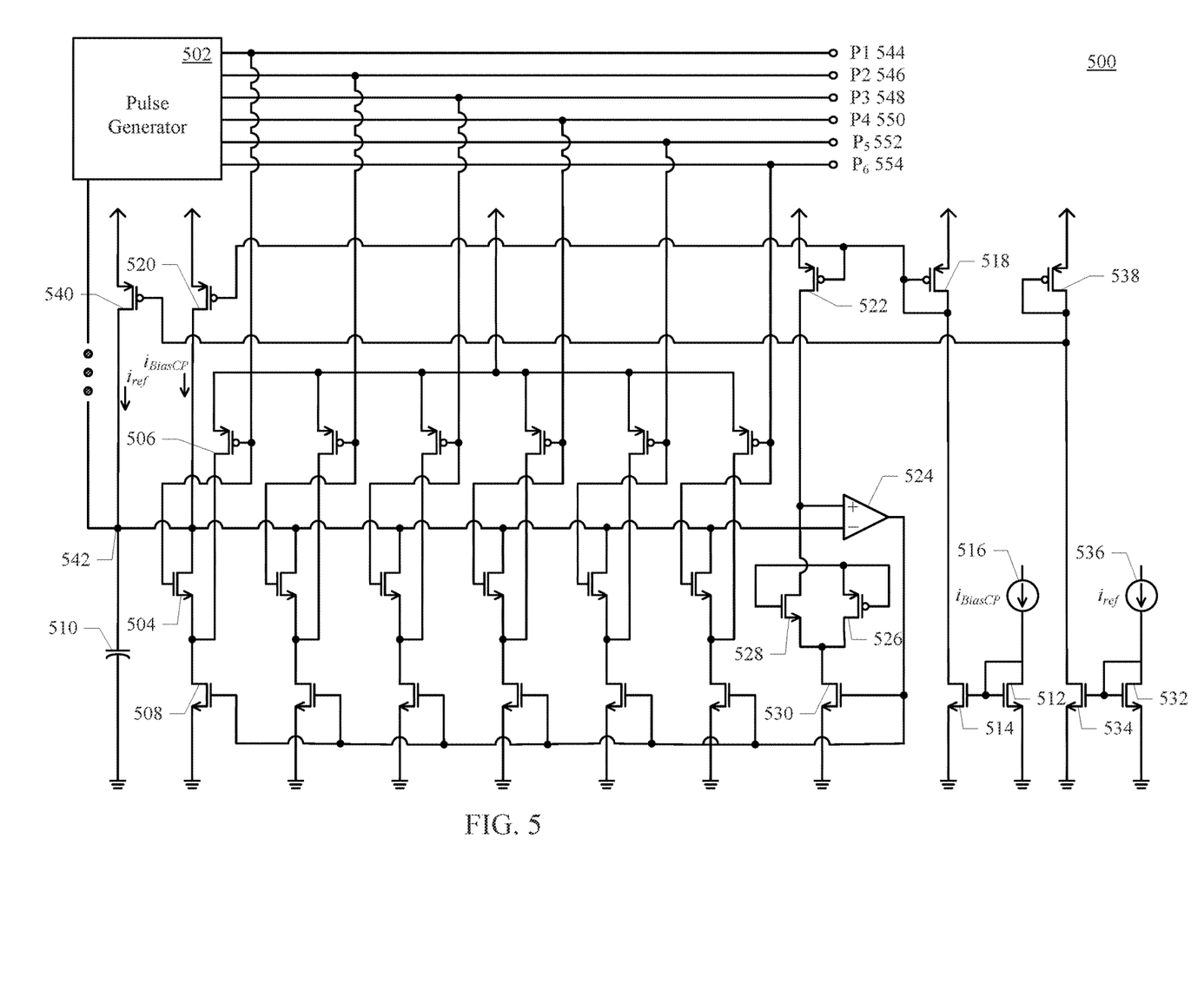
FIG. 5 shows a pulse signal compensation circuit, in accordance with another embodiment of the present invention.

Referring now to FIG. 5, a pulse signal compensation circuit, in accordance with another embodiment of the present invention, in shown. The pulse signal compensation circuit 500 can include a pulse generator 502, a pulse signal compensation circuit 504-540 and compensation generation circuit (not shown). The pulse generator 502 can be configured to generate a plurality of pulse signals $P_1$-$P_6$ 544-554. Although the pulse generator 502 is illustrated as generating six pulse signals $P_1$-$P_6$ 544-554, a given pulse generator can be configured to generate any number of pulse signals.

The pulse signal compensation circuit 504-540 can be coupled to receive a plurality of pulse signals $P_1$-$P_6$ 544-554 generated by the pulse generator 502. The pulse measurement circuit can include a plurality of current mode switches 504-506, wherein each current mode switch 504-506 is coupled to a respective one of the plurality of pulse signals $P_1$-$P_6$ 544-554. In one implementation, the plurality of current mode switches 504-506 can each include a NMOS 504 and PMOS 506 switch, with the gates coupled to a respective pulse signal, the sources coupled to respective current tails 508, and the drains coupled to together. When a pulse 544 is high, the current goes through the respective NMOS switch 504. When the pulse 544 is low the current goes through the PMOS switch 506. Therefore, the current tail 508 is not turned off and the current mode switch 504, 506 is suitable for turning on and off at high speeds.

The charge pump bias generator circuit can include a charge pump capacitor 510, a bias current mirror 512-520, a current tail bias circuit 522-530, and a reference current mirror 532-540. The bias current mirror 512-520 can be configured to cause a charge pump bias current $i_{biasCP}$ to flow into a first node 542 and on to the charge pump capacitor 510. The bias current mirror 512-520 can also be configured to cause the charge pump bias current $i_{biasCP}$ to flow into the current tail bias circuit 522-530. The current tail bias circuit 522-530 can be configured to cause the charge pump bias current $i_{biasCP}$ to also flow through the current tails 508. The reference current mirror 532-540 is configured to generate a predetermined reference current $i_{ref}$ for a desired duty cycle and or pulse overlap. The reference current mirror 532-540 can be configured to cause the reference current $i_{ref}$ to flow into the first node 542.

In one example, the compensation current $i_{comp}$ generated by the pulse signal compensation circuit 504-540 at the first node 542 can be represented by Equation 6:

$$i_{comp} = i_{ref} - \frac{n\Delta t}{T} i_{BiasCP} \tag{6}$$

where $\Delta t$ is the overlap time of adjacent pulses, n is the number of pulse signals, and T is the period. The compensation current $i_{comp}$ can be received by the compensation generator circuit (not shown). The compensation generator circuit can be an integrator circuit similar to the compensation generator circuit described above with reference to FIG. 4. The compensation generator circuit can integrate the compensation current $i_{comp}$ over time to generate a duty cycle or pulse overlap compensation signal $V_{comp}$. The duty cycle or pulse overlap compensation signal $V_{comp}$ generated by the compensation generator circuit can be represented by Equation 7:

$$v_{comp} \propto \int \frac{i_{ref} - \frac{n\Delta t}{T} i_{BiasCP}}{C} dt \tag{7}$$

The pulse signal compensation circuit 504-540 and compensation generator circuit can implement a proportional/integrating feedback loop for adjusting the duty cycle and or pulse overlap of the plurality of pulse signals $P_1$-$P_6$ 544-554 generated by the pulse generator 502. Furthermore, the pulse signal compensation circuit can be considered to be a current mode charge pump pulse compensation circuit.

The duty cycle or pulse overlap compensation signal $V_{comp}$ can be supplied to the pulse generator 502. The duty cycle or pulse overlap compensation signal $V_{comp}$ can be utilized to adjust the duty cycle and or the amount of overlap or non-overlap between the plurality of pulse signals $P_1$-$P_6$ 544-554 to compensate for manufacturing process, voltage, temperature and other similar variations in the pulse generator 502. The improved control of pulse signal duty cycle and or overlap can improve the performance of mixers in transmitters and receivers, and other similar circuits that utilize a plurality of pulse signals.

Again, the pulse signal compensation circuit 504-540 can be implemented as a sub-circuit integral to the pulse generator 502. In another implementation, the pulse signal compensation circuit 504-540 can be implemented as a standalone circuit coupled to a pulse generator 502.

Figure 6:
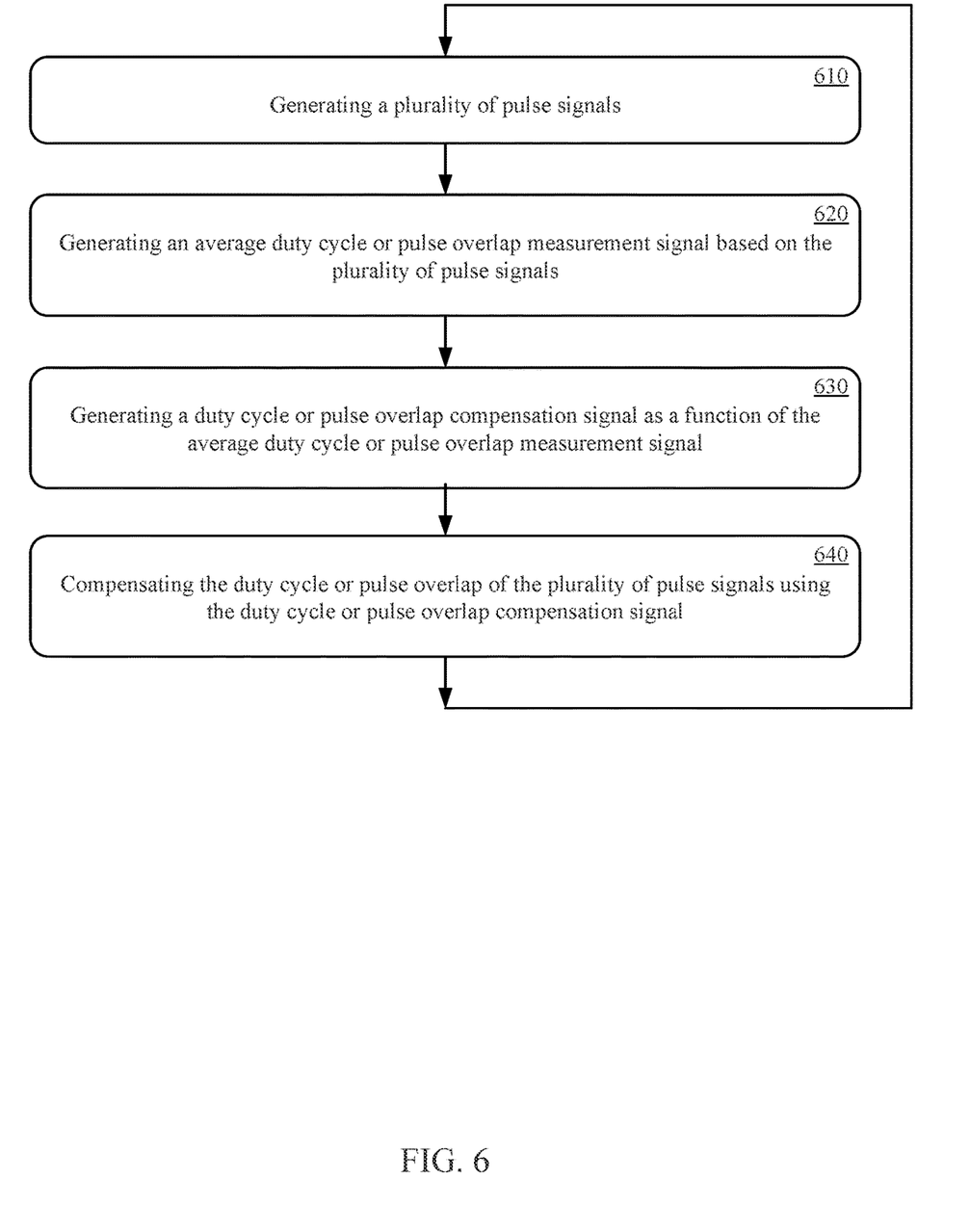
FIG. 6 shows a method of compensating a duty cycle of a plurality of pulse signals, in accordance with embodiments of the present invention.

Referring now to FIG. 6, a method of compensating a duty cycle of a plurality of pulse signals, in accordance with embodiments of the present invention, is shown. The method can include receiving a plurality of pulse signals, at 610. At 620, an average duty cycle or pulse overlap measurement signal can be generated based on the plurality of pulse signals. In one implementation, an average duty cycle or pulse overlap voltage can be generated as a function of reference current and a variable resistive circuit controlled by the plurality of pulse signals. In another implementation, an average duty cycle or pulse overlap current can be generated as a function of reference current and a variable resistive circuit controlled by the plurality of pulse signals. In yet another implementation, an average duty cycle or pulse overlap current can be generated by a charge pump controlled by the plurality of pulse signals. At 630, a duty cycle or pulse overlap compensation signal can be generated as a function of the average duty cycle or pulse overlap measurement signal. In one implementation, a duty cycle or pulse overlap compensation voltage can be generated based on a difference between the average duty cycle or pulse overlap voltage and a reference voltage. In yet another implementation, the duty cycle or pulse overlap compensation voltage can be generated by integrating the average duty cycle or pulse overlap current over time. At 640, the duty cycle or pulse overlap of the plurality of pulse signals can be adjusted using the duty cycle or pulse overlap compensation signal to compensate for variations in the manufacturing process, for supply voltage variations, for operating temperature variations, and other similar variations that can affect the accuracy of the plurality of pulse signals. The processes at 610-640 can be iteratively repeated to periodically or continuously compensate the duty cycle or pulse overlap of the plurality of pulse signals.

Figure 7:
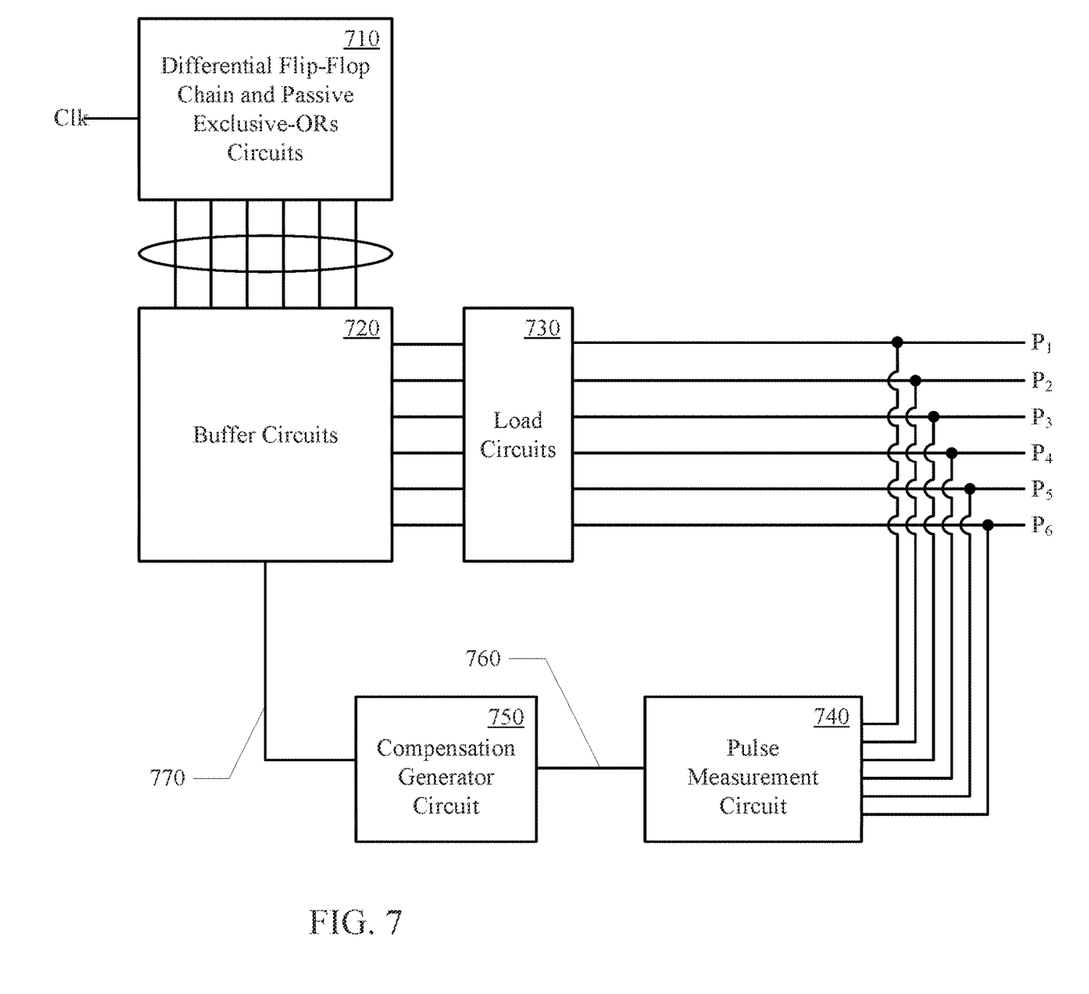
FIG. 7 shows a pulse signal generator, in accordance with embodiments of the present invention.

Referring now to FIG. 7, a pulse signal generator, in accordance with embodiments of the present invention, is shown. The pulse signal generator 700 can include differential flip-flop chains and passive Exclusive-ORs circuits 710, buffer circuits 720, load circuits 730, a pulse measurement circuit 740, and a compensation generator circuit 750. The differential flip-flop chain and passive Exclusive-OR circuits 710 can receive a clock signal (Clk) and generate a plurality of pulse signals. The plurality of pulse signals can be characterized by a given duty cycle, pulse overlap and or similar parameters that are subject to variations due to process, voltage, temperature (PVT) variations or the like. The buffer circuit 720 can provide an output drive for the plurality of pulse signal generated by the differential flip-flop chain and passive Exclusive-OR circuit 710. The plurality of pulse signals can then pass through the load circuits 730 before being output by the pulse signal generator 700. The load circuits 730 can include N-path filters, finite impulse response (FIR) filters, switch capacitor filter or the like. Although the pulse signal generator 700 is illustrated as generating six pulse signals $P_1$-$P_6$, a given pulse signal generator can be configured to generate any number of pulse signals.

The pulse measurement circuit 740 and compensation generator circuit 750 can be coupled in a feedback loop between the output of the load circuits 730 and the buffer circuits 720. The pulse measurement circuit 740 can be configured to generate an average duty cycle or pulse overlap signal 760 as a function of the plurality of pulse signals $P_1$-$P_6$ generated by pulse signal generator 700. The compensation generator circuit 750 can be configured to generate a duty cycle or pulse overlap compensation signal 770 as a function of the average duty cycle or pulse overlap signal 760. The duty cycle or pulse overlap compensation signal 770 can be fed back to the buffer circuits 720 to adjust the duty cycle and or pulse overlap of the plurality of pulse signals $P_1$-$P_6$. For example, the buffer circuits 720 can be configured to control the switching points therein for the purpose of adjusting the duty cycle and or pulse width of the plurality of pulse signals $P_1$-$P_6$ based on the duty cycle or pulse overlap compensation signal 770. The duty cycle and pulse overlap can be adjusted to compensate for the process, voltage, temperature and other similar variations induced in the plurality of pulse signals $P_1$-$P_6$.

The pulse signal compensation circuits, in accordance with embodiments of the present invention, can advantageously generate a signal for use by a pulse generator in adjusting the duty cycle and or pulse overlap of the plurality of pulse signals to compensate for manufacturing process variations, supply voltage variations, operating temperature variations and the like. The improved control of pulse signal duty cycle and or pulse overlap can improve the performance of mixers in transmitters and receivers, and other similar circuits that utilize a plurality of pulse signals.

The following examples pertain to specific technology embodiments and point out specific features, elements, or steps that may be used or otherwise combined in achieving such embodiments.

Example 1 includes a circuit comprising: a pulse measurement circuit 110 configured to generate an average duty cycle or pulse overlap signal 140 based on a plurality of pulse signals 120-135; a compensation generator circuit 115 configured to generate a duty cycle or pulse overlap compensation signal 145 based on the average duty cycle or pulse overlap signal 140; and a pulse generator 150 configured to generate the plurality of pulse signals 120-135 based on the duty cycle or pulse overlap compensation signal 145.

Example 2 includes the circuit of Example 1, wherein the pulse measurement circuit (110) and the compensation generator circuit 115 comprise a proportional feedback loop of the pulse generator 150.

Example 3 includes the circuit of Example 1, wherein the pulse measurement circuit 110 and the compensation generator circuit 115 comprise a proportional/integral feedback loop of the pulse generator 150.

Example 4 includes the circuit of Example 3, wherein the pulse measurement circuit 110 and the compensation generator circuit 115 in the proportional/integral feedback loop comprises an operational amplifier capacitor integrator 404-432.

Example 5 includes the circuit of Example 3, wherein the pulse measurement circuit 110 and the compensation generator circuit 115 in the proportional/integral feedback loop comprises a current charging capacitor integrator (504-540).

Example 6 include the circuit of Example 3, wherein the pulse measurement circuit (110) comprises a variable resistance based pulse measurement circuit 304-328.

Example 7 includes the circuit of Example 6, wherein the pulse measurement circuit 110 includes a voltage mode reference for comparison.

Example 8 includes the circuit of Example 6, wherein the pulse measurement circuit 110 includes a current mode reference for comparison.

Example 9 includes the circuit of Example 3, wherein the pulse measurement circuit 110 includes a bias circuit to match a plurality of comparison circuits of the pulse measurement circuit.

Example 10 includes a pulse signal compensation circuit comprising: a pulse measurement circuit 110 configured to receive a plurality of pulse signals 120-135 and to generate an average duty cycle or pulse overlap signal 140 proportional to a duty cycle or pulse overlap of the plurality of pulse signals 120-135; and a compensation generator circuit 115 configured to receive the average duty cycle or pulse overlap signal 140 and generate a duty cycle or pulse overlap compensation signal 145 based on the average duty cycle or pulse overlap signal 140.

Example 11 includes the pulse signal compensation circuit of Example 10, wherein the plurality of pulse signals 120-135 comprise a plurality of phase shifted pulse signals.

Example 12 includes the pulse signal compensation circuit of Example 10, wherein: the pulse measurement circuit 110 comprises; a plurality of resistive switching elements 304-314 coupled between a first supply potential and a first node and controlled by the plurality of pulse signals 120-135; and a constant current source 316-320 coupled between the first node and a second supply potential; and the compensation generator circuit 115 comprises an inverting operational amplifier 324 with a predetermined gain and including a non-inverting input coupled to a reference voltage, an inverting input coupled to the first node 342 and an output coupled to a second node 344.

Example 13 includes the pulse signal compensation circuit of Example 10, wherein: the pulse measurement circuit 110 comprises; a plurality of resistive switching elements 304-314, 404-414 coupled between a first supply potential and a first node 342, 446 and controlled by the plurality of pulse signals 120-135; and a constant current source 316-320, 416-420 coupled between the first node 342, 446 and a second supply potential; and the compensation generator circuit 115 comprises an integrating operational amplifier 324 including a capacitor coupled between an inverting input and an output, a non-inverting input coupled to a duty cycle voltage, the inverting input coupled to the first node 342 and the output coupled to a second node 344.

Example 14 includes the pulse signal compensation circuit of Examples 12 or 13, wherein the plurality of resistive switching elements 304-314, 404-414 each comprise a Metal-Oxide-Semiconductor Field Effect Transistor (MOSFET) including a source coupled to the first supply potential, a drain coupled to a first node 342, 446, and a gate coupled to a respective one of the plurality of pulse signals 120-135.

Example 15 includes the pulse signal compensation circuit of Example 13, wherein: the pulse measurement circuit 110 further comprises; a supply compensation current mirror 422-426 coupled between the first node 446 and the second supply potential.

Example 16 includes the pulse signal compensation circuit of Example 10, wherein the pulse measurement circuit 110 comprises: a charge pump including a plurality of current mode switches 504, 506 controlled by the plurality of pulse signals 120-135.

Example 17 includes the pulse signal compensation circuit of Example 10, wherein the duty cycle or pulse overlap compensation signal 145 is applied as a feedback to a pulse generator 150.

Example 18 includes the pulse signal compensation circuit of Example 17, the pulse generator 150 includes a buffer circuit 720 configured to control a switching point based on the duty cycle or pulse overlap compensation signal 145.

Example 19 includes a method of compensating a duty cycle of a plurality of pulse signals comprising: generating the plurality of pulse signals 610; generating an average duty cycle or pulse overlap measurement signal based on the plurality of pulse signals 620;

generating a duty cycle or pulse overlap compensation signal as a function of the average duty cycle or pulse overlap measurement signal 630; and compensating the duty cycle or pulse overlap of the plurality of pulse signals using the duty cycle or pulse overlap compensation signal 640.

Example 20 includes the method according to Example 19, wherein the average duty cycle or pulse overlap measurement signal comprises a voltage generated as a function of a variable switching resistance controlled by the plurality of pulse signals, a supply voltage, and a constant current source.

Example 21 includes the method according to Example 20, wherein the duty cycle or pulse overlap compensation signal comprises a voltage generated as a function of a predetermined gain and a difference between the average duty cycle or pulse overlap signal voltage and a reference voltage.

Example 22 includes the method according to Example 19, wherein the average duty cycle or pulse overlap measurement signal comprises a current generated as a function of a variable switching resistance controlled by the plurality of pulse signals, a supply voltage, and a constant current source.

Example 23 includes the method according to Example 22, wherein the average duty cycle or pulse overlap measurement signal comprises the current further generated as a function of a supply compensation current.

Example 24 includes the method according to Example 22, wherein the duty cycle or pulse overlap compensation signal comprises a voltage generated by integrating over the average duty cycle or pulse overlap signal current.

Example 25 includes the method according to Example 19, wherein the average duty cycle or pulse overlap measurement signal comprises a current generated by a charge pump controlled by the plurality of pulse signals.

Example 26 includes the method according to Example 25, wherein the duty cycle or pulse overlap compensation signal comprises a voltage generated by integrating over the average duty cycle or pulse overlap signal current.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the present invention and its practical application, to thereby enable others skilled in the art to best utilize the present invention and various embodiments with various modifications as are suited to the particular use contemplated. It is intended that the scope of the invention be defined by the claims appended hereto and their equivalents.

What is claimed is:
1. A circuit comprising:
a pulse measurement circuit configured to generate an average duty cycle or pulse overlap signal based on a plurality of pulse signals, the pulse measurement circuit including;
a plurality of resistive switching elements coupled between a first supply potential and a first node and controlled by the plurality of pulse signals; and
a constant current source coupled between the first node and a second supply potential;
a compensation generator circuit configured to generate a duty cycle or pulse overlap compensation signal based on the average duty cycle or pulse overlap signal, the compensation generator circuit including an inverting operational amplifier with a predetermined gain and including a non-inverting input coupled to a reference voltage, an inverting input coupled to the first node and an output coupled to a second node; and
a pulse generator configured to generate the plurality of pulse signals based on the duty cycle or pulse overlap compensation signal.

2. The circuit of claim 1, wherein the pulse measurement circuit and the compensation generator circuit comprise a proportional feedback loop of the pulse generator.

3. The circuit of claim 1, wherein the pulse measurement circuit and the compensation generator circuit comprise a proportional/integral feedback loop of the pulse generator.

4. The circuit of claim 3, wherein the pulse measurement circuit and the compensation generator circuit in the proportional/integral feedback loop comprises an operational amplifier capacitor integrator.

5. The circuit of claim 3, wherein the pulse measurement circuit and the compensation generator circuit in the proportional/integral feedback loop comprises a current charging capacitor integrator.

6. The circuit of claim 3, wherein the pulse measurement circuit comprises a variable resistance based pulse measurement circuit.

7. The circuit of claim 3, wherein the pulse measurement circuit includes a bias circuit to match a plurality of comparison circuits of the pulse measurement circuit.

8. A pulse signal compensation circuit comprising:
a pulse measurement circuit configured to receive a plurality of phase shifted pulse signals and to generate an average duty cycle or pulse overlap signal proportional to a duty cycle or pulse overlap of the plurality of phase shifted pulse signals, wherein the pulse measurement circuit comprises;
a plurality of resistive switching elements coupled between a first supply potential and a first node and controlled by the plurality of pulse signals; and
a constant current source coupled between the first node and a second supply potential; and
a compensation generator circuit configured to receive the average duty cycle or pulse overlap signal and generate a duty cycle or pulse overlap compensation signal based on the average duty cycle or pulse overlap signal, wherein the compensation generator circuit comprises an inverting operational amplifier with a predetermined gain and including a non-inverting input coupled to a reference voltage, an inverting input coupled to the first node and an output coupled to a second node.

9. The pulse signal compensation circuit of claim 8, wherein the plurality of resistive switching elements each comprise a Metal-Oxide-Semiconductor Field Effect Transistor (MOSFET) including a source coupled to the first supply potential, a drain coupled to a first node, and a gate coupled to a respective one of the plurality of pulse signals.

10. The pulse signal compensation circuit of claim 8, wherein the pulse measurement circuit further comprises:
a charge pump including a plurality of current mode switches controlled by the plurality of pulse signals.

11. A method of compensating a duty cycle of a plurality of pulse signals comprising:
generating the plurality of phase shifted pulse signals;
generating an average duty cycle or pulse overlap measurement signal based on the plurality of phase shifted pulse signals;
generating a duty cycle or pulse overlap compensation signal as a function of the average duty cycle or pulse overlap measurement signal from a plurality of resistive switching elements coupled between a first supply potential and a first node and controlled by the plurality of pulse signals and a constant current source coupled between the first node and a second supply potential; and
compensating the duty cycle or pulse overlap of the plurality of phase shifted pulse signals using the duty cycle or pulse overlap compensation signal.

12. The method according to claim 11, wherein the average duty cycle or pulse overlap measurement signal comprises a voltage generated as a function of a variable switching resistance of the plurality of resistive switching elements controlled by the plurality of pulse signals, the first supply potential, and the constant current source.

13. The method according to claim 12, wherein the duty cycle or pulse overlap compensation signal comprises a voltage generated as a function of a predetermined gain and a difference between the average duty cycle or pulse overlap signal voltage and a reference voltage.

14. The method according to claim 11, wherein the average duty cycle or pulse overlap measurement signal comprises a current generated as a function of a variable switching resistance of the plurality of resistive switching elements controlled by the plurality of pulse signals, the first supply potential, and the constant current source.

15. The method according to claim 14, wherein the average duty cycle or pulse overlap measurement signal comprises the current further generated as a function of a supply compensation current.

16. The method according to claim 14, wherein the duty cycle or pulse overlap compensation signal comprises a voltage generated by integrating over the average duty cycle or pulse overlap signal current.

17. A pulse signal compensation circuit comprising:
a pulse measurement circuit configured to receive a plurality of phase shifted pulse signals and to generate an average duty cycle or pulse overlap signal proportional to a duty cycle or pulse overlap of the plurality of phase shifted pulse signals, wherein the pulse measurement circuit comprises;
a plurality of resistive switching elements coupled between a first supply potential and a first node and controlled by the plurality of pulse signals; and
a constant current source coupled between the first node and a second supply potential; and
a compensation generator circuit configured to receive the average duty cycle or pulse overlap signal and generate a duty cycle or pulse overlap compensation signal based on the average duty cycle or pulse overlap signal, wherein the compensation generator circuit comprises an integrating operational amplifier including a capacitor coupled between an inverting input and an output, a non-inverting input coupled to a duty cycle voltage, the inverting input coupled to the first node and the output coupled to a second node.

18. The pulse signal compensation circuit of claim 17, wherein the plurality of resistive switching elements each comprise a Metal-Oxide-Semiconductor Field Effect Transistor (MOSFET) including a source coupled to the first supply potential, a drain coupled to a first node, and a gate coupled to a respective one of the plurality of pulse signals.

19. The pulse signal compensation circuit of claim 17, wherein:
the pulse measurement circuit further comprises;
a supply compensation current mirror coupled between the first node and the second supply potential.

* * * * *